(12) United States Patent
Yi

(10) Patent No.: US 10,269,645 B2
(45) Date of Patent: Apr. 23, 2019

(54) FIN FIELD-EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Xu Dong Yi, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 0 days.

(21) Appl. No.: 15/792,439

(22) Filed: Oct. 24, 2017

(65) Prior Publication Data
US 2018/0130710 A1    May 10, 2018

(30) Foreign Application Priority Data
Nov. 8, 2016   (CN) .......................... 2016 1 0991129

(51) Int. Cl.
*H01L 21/027*   (2006.01)
*H01L 21/265*   (2006.01)
(Continued)

(52) U.S. Cl.
CPC .. *H01L 21/823418* (2013.01); *H01L 21/0273* (2013.01); *H01L 21/26586* (2013.01);
(Continued)

(58) Field of Classification Search
CPC ........... H01L 21/0273; H01L 21/26586; H01L 21/823418; H01L 21/823431;
(Continued)

(56) References Cited

U.S. PATENT DOCUMENTS

2010/0248152 A1* 9/2010 Scheer ................ H01L 21/0332
430/311
2013/0337383 A1 12/2013 Hatakeyama et al.
(Continued)

OTHER PUBLICATIONS

The European Patent Office (EPO) The Extended European Search Report for 17200235.4 Mar. 9, 2018 11 Pages.

*Primary Examiner* — Joseph M Galvin, III
(74) *Attorney, Agent, or Firm* — Anova Law Group, PLLC

(57) ABSTRACT

Fin field-effect transistors (FinFETs) and fabrication methods thereof are provided. An exemplary fabrication method includes providing a base substrate having a plurality of fins; forming gate structures over the base substrate; forming a photoresist film having a plurality of exposure regions and non-exposure regions over the base substrate, the fins and the gate structures, wherein the exposure regions have first regions above the top surfaces of the gate structures and second regions below the top surfaces of the gate structures; performing an exposure process to the photoresist film; performing a post-baking process to cause photoacid in the second regions of the exposure regions to diffuse into portions of the photoresist film below the top surfaces of the gate structures in the non-exposure regions; developing exposed photoresist film to form photoresist layers; and performing a function doping process to the fins using the photoresist layers as a mask.

20 Claims, 5 Drawing Sheets

(51) Int. Cl.
  *H01L 21/8238*  (2006.01)
  *H01L 21/8234*  (2006.01)
  *H01L 27/088*  (2006.01)
  *H01L 29/66*  (2006.01)
  *H01L 29/78*  (2006.01)

(52) U.S. Cl.
  CPC ........... *H01L 21/823431* (2013.01); *H01L 21/823437* (2013.01); *H01L 21/823814* (2013.01); *H01L 21/823821* (2013.01); *H01L 27/0886* (2013.01); *H01L 29/66492* (2013.01); *H01L 29/7833* (2013.01)

(58) Field of Classification Search
  CPC ..... H01L 21/823437; H01L 21/823814; H01L 21/823821; H01L 27/0886; H01L 29/66492; H01L 29/7833
  See application file for complete search history.

(56) References Cited

U.S. PATENT DOCUMENTS

2016/0042952 A1* 2/2016 Tsai .................... H01L 29/6653
                                                            438/154
2016/0315191 A1  10/2016 Tsai et al.

\* cited by examiner

FIN FIELD-EFFECT TRANSISTOR AND FABRICATION METHOD THEREOF

CROSS-REFERENCES TO RELATED APPLICATIONS

This application claims the priority of Chinese patent application No. 201610991129.2, filed on Nov. 8, 2016, the entirety of which is incorporated herein by reference.

FIELD OF THE DISCLOSURE

The present disclosure generally relates to the field of semiconductor manufacturing technologies and, more particularly, relates to fin field-effect transistors (FinFETs) and fabrication methods thereof.

BACKGROUND

In the manufacturing processes of integrated circuits (ICs), the fabrication of chips includes a plurality of steps, such as a deposition process, a polishing process, a photolithography process, an etching process, a diffusion process and a doping process, etc. The photolithography process forms a photoresist mask having designed mask patterns by exposing, developing, fixing and curing, etc., a photoresist film to dissolve some regions of the photoresist film.

The photoresist mask is used as a mask for the doping process to dope the regions having no protection from the photoresist. The photoresist mask is also used as a pattern transfer mask to transfer the patterns on the photoresist mask to a silicon wafer by the etching process. Specifically, the portions of the surface of the silicon wafer having no protection of the photoresist mask are etched, and removed.

With the continuous development of the semiconductor technologies, the performances of the FinFETs formed by the existing technologies that use the photoresist mask to perform the doping process need further improvements. The disclosed methods and semiconductor structures are directed to solve one or more problems set forth above and other problems in the art.

BRIEF SUMMARY OF THE DISCLOSURE

One aspect of the present disclosure includes a method for fabricating fin field-effect transistors (FinFETs). The method includes providing a base substrate having a plurality of fins; forming a plurality of gate structures, each gate structure covering side and top surfaces of at least one fin, over the base substrate; forming a photoresist film, having a plurality of exposure regions and a plurality of non-exposure regions, over the base substrate, the fins and the gate structures, wherein the exposure regions have first regions above the top surfaces of the gate structures and second regions below the top surfaces of the gate structures; performing an exposure process to the photoresist film, a concentration of the photoacid generated in the first regions being smaller than a concentration of the photoacid generated in the second regions; performing a post-baking process to cause photoacid in the second regions of the exposure regions to diffuse into portions of the photoresist film below the top surfaces of the gate structures in the non-exposure regions; developing exposed photoresist film to form photoresist layers; and performing a function doping process to the fins using the photoresist layers as a mask.

Another aspect of the present disclosure includes an FinFET device. The FinFET device includes a semiconductor substrate; a plurality of fins formed on the semiconductor substrate; an isolation layer formed on the surface of the semiconductor substrate, covering portions of the side surfaces of the fins, and with top surface below the top surfaces of the fins; a plurality of gate structures, crossing over the plurality of fins and covering positions of the side surfaces of the fins, formed on the surface of the isolation layer; and lightly doped drain (LDD) regions formed in the fins at both sides of each of the gate structures. The lightly doped drain (LDD) regions are formed by forming a photoresist film, having a plurality of exposure regions and a plurality of non-exposure regions, over the base substrate, the fins and the gate structures, portions of the exposure regions above the top surfaces of the gate structures being configured as first regions and portions of the exposure regions below the top surfaces of the gate structures being configured as second regions; performing an exposure process to the photoresist film; performing a post-baking process to cause photoacid in the second regions to diffuse into portions of the photoresist film below the top surfaces of the gate structures in the non-exposure regions; developing exposed photoresist film to form photoresist layers; and performing a function doping process to the fins using the photoresist layers as a mask.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
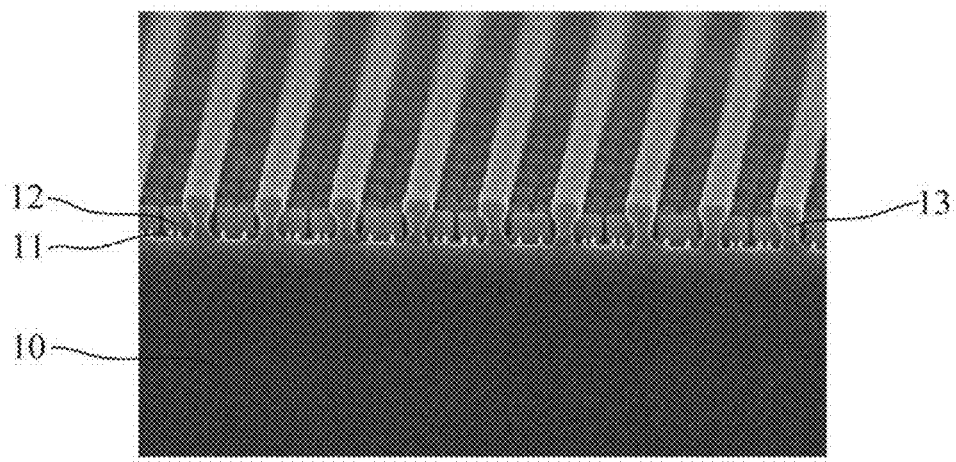
FIG. 1 is a scanning electron microscope (SEM) image of an FinFET device.
Figure 2:
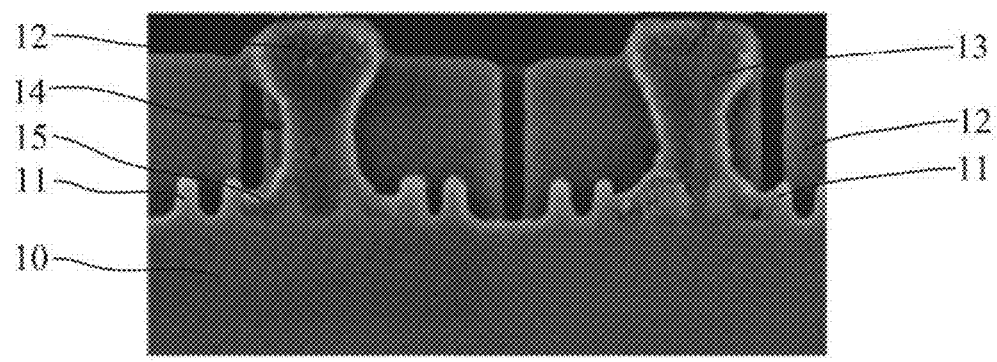
FIG. 2 is an SEM image of a portion of the FinFET device illustrated in FIG. 1.

An FinFET device may include lightly doped drain (LDD) regions. FIGS. 1-2 are scanning electron microscope (SEM) images of an FinFET device. Specifically, FIG. 2 is an SEM image of a portion of the FinFET device shown in FIG. 1.

The method for forming the LDD regions includes providing a semiconductor substrate 10; and forming a plurality of fins 11 on the semiconductor substrate 10. The method also includes forming a plurality of gate structures 12 over the semiconductor substrate 10. Each gate structure 12 crosses over at least one fin 11; and each gate structure 12 covers the side and top surfaces of the fins 11. Further, the method includes forming a photoresist layer 13 on the top of the gate structures 12 and the semiconductor substrate 10 between adjacent gate structures 12. The photoresist layer 13 covers portions of the surfaces of the fins 11. The regions of the fins 11 without being covered by the photoresist layer 13 are the regions need to be processed by a subsequent LDD doping process. Further, the method includes performing an ion implantation process to the exposed regions of the fins 11 using the photoresist layer 13 as a mask to form LDD regions.

The LDD regions may be formed having position deviations, and the formed FinFET devices may have undesirable performance. One of the reasons for having such deviations is that the photoresist layer 13 has necking defects 14 and bottom-residue defects 15. The necking defects 14 cause un-sufficient protection of the fins 11 that need protection, which may cause ion implantation in undesirable areas of the fins 11. The bottom-residue defects 15 cause the fins 11 under the bottom-residue defects 15 to be over protected; and the regions of the fins 11 need to be doped are not doped by the ion implantation process.

At the same time, during the semiconductor manufacturing process, it needs to obtain position and size parameters to timely adjust the fabrication process of the photoresist layer 13. When the photoresist layer 13 has the bottom-residue defects 15, the measured size of the photoresist layer 13 also includes the size of the bottom-residue defects 15; and the measured positions also include the positions of the bottom-residue defects 15. Thus, the accuracy for adjusting the parameters of the process for forming the photoresist layer 13 using measured position and size parameters of the photoresist layer 13 may be unacceptable. Accordingly, the electrical properties of the FinFET device are affected.

The process for forming the photoresist layer 13 includes spin-coating a photoresist film; exposing the photoresist film; and developing the exposed photoresist film. Because the side surfaces of the photoresist layer locate on the semiconductor substrate 10 between adjacent gate structures 12, the depth-to-width ratio of the poly trenches between adjacent gate structures 12 is relatively large. Thus, the intensity of the reflective light received by the portions of the photoresist film on the portions of the semiconductor substrate 10 between adjacent gate structures 12 is relatively large. Accordingly, after developing the exposed photoresist film, the photoresist layer 13 has the necking defects 14 and the bottom-residue defects 15.

To overcome such issues, a bottom anti-reflective coating (BARC) is usually formed on the semiconductor substrate, the fins and the gate structures before forming the photoresist layer. However, the BARC increases the process complexity; and the BARC also has defects.

The present disclosure provides an FinFET device and a fabrication method thereof. The fabrication method includes providing a semiconductor substrate having a plurality of fins protruding from the semiconductor substrate on the semiconductor substrate; and forming a plurality of gate structures crossing over the plurality of fins on the semiconductor substrate. Each gate structure may cover the portions of the side and top surfaces of at least one fin. The method may also include forming a photoresist film over the semiconductor substrate, the fins and the gate structures. The top surface of the photoresist film may be above the top surfaces of the fins. The photoresist film may include a plurality of exposure regions and a plurality of non-exposure regions. The exposure regions above the top surfaces of the fins may be referred to as first regions; and the exposure regions below the top surfaces of the fins may be referred to as second regions. The exposure regions may locate above at least one fin and the boundary lines between the exposure regions and the non-exposure regions may locate between adjacent fins. Further, the method may include performing an exposure process to the photoresist film. The photoacid concentration in the portions of the photoresist film in the first regions may be lower than the photoacid concentration in the portions of the photoresist film in the second regions. Further, the method may include performing a post-baking to the exposed photoresist film to cause the photoacid in the second regions to diffuse into the portions of the photoresist film below the top surfaces of the gate structures in the non-exposure regions. Further, the method may also include developing the baked photoresist film to remove the portions of the photoresist film in the exposure regions and the portions of the photoresist film below the top surfaces of the gate structures in the non-exposure regions and keep the portions of the photoresist film above the top surface of the gate structures in the non-exposure regions to form a plurality of photoresist layers. The photoresist layers may cross over at least one gate structure; and expose portions of the fins. Further, the method may also include performing a function doping process to the exposed fins using the photoresist layers as a mask.

In the disclosed methods, when the exposure process and the developing process are used to form the photoresist layers, the developing process may remove the portions of the photoresist film below the top surfaces of the gate structures in the non-exposure regions, the necking defects and the bottom-residue defects caused by the portions of the photoresist film below the top surfaces of the gate structures in the non-exposure regions receiving a relatively strong reflective light may be avoided. The position accuracy of the fins need the subsequent function doping process defined by the photoresist layers may be increased. Thus, the quality of the function doping process may be improved; and the electrical properties of the FinFETs may enhanced.

Figure 11:
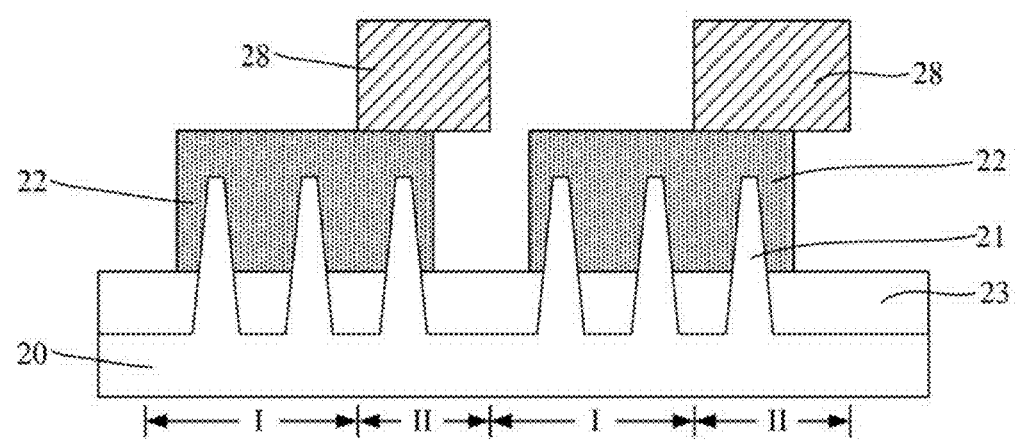
Figure 12:
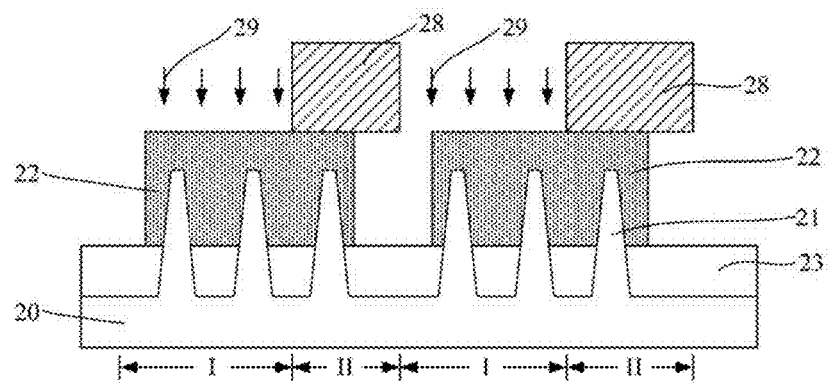
Figure 13:
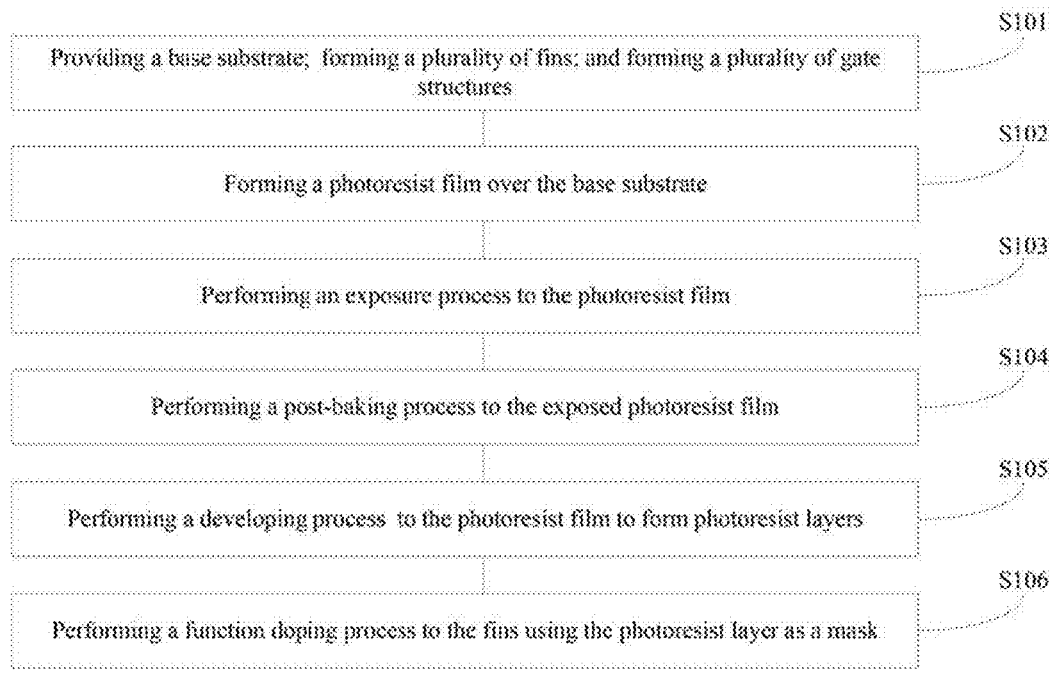
FIG. 13 illustrates an exemplary fabrication process of an FinFET device consistent with the disclosed embodiments.

FIG. 13 illustrates an exemplary fabrication process of FinFETs consistent with the disclosed embodiments. FIGS. 3-12 illustrate semiconductor structures corresponding to certain stages of the exemplary fabrication process.

Figure 3:
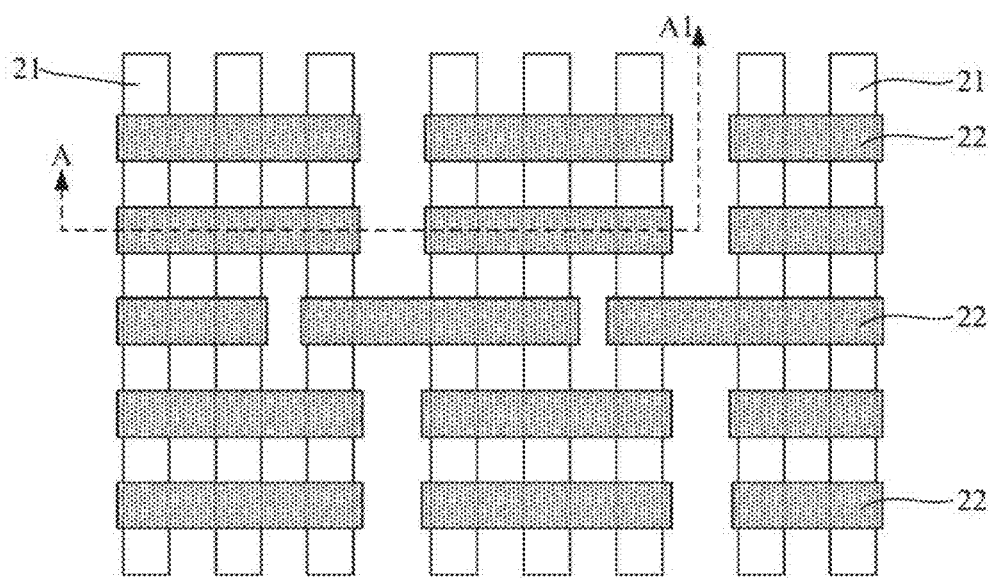
FIGS. 3-12 illustrate semiconductor structures corresponding to certain stages during an exemplary fabrication process of an FinFET device consistent with the disclosed embodiments.
Figure 4:
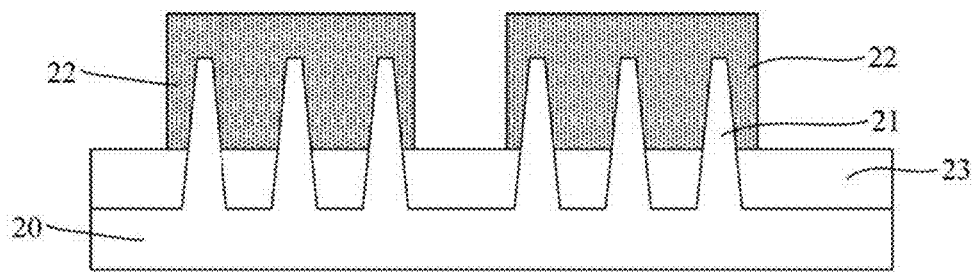

As shown in FIG. 13, at the beginning of the fabrication process, a base substrate with certain structures is provided (S101). FIGS. 3-4 illustrate a corresponding semiconductor structure. FIG. 3 is a top view of the semiconductor structure; and FIG. 4 is a cross-sectional view of the semiconductor structure illustrated in FIG. 3 along the AA1 direction.

As shown FIGS. 3-4, a base substrate is provided. A plurality of fins 21 protruding from the base substrate may be formed on the base substrate; and a plurality of gate structures 22 crossing over the fins 21 may be formed over the base substrate. Each gate structure 22 may cover portions of the side and top surfaces of at least one fin 21.

In one embodiment, to avoid the electrical connection between adjacent fins 21, the base substrate may include a semiconductor substrate 20; and an isolation layer 23 formed on the semiconductor substrate 20. The fins 21 may be formed on the semiconductor substrate 20. The isolation layer 23 may cover the side surfaces of the fins 21; and the top surface of the isolation layer 23 may be below the top surfaces of the fins 21.

The semiconductor substrate 20 may be made of any appropriate material, such as silicon, germanium, silicon germanium, silicon carbide, gallium arsenide, or gallium indium, etc. The semiconductor substrate 20 may also be a silicon on insulator (SOI) substrate, or a germanium on insulator (GOI) substrate. The fins 21 may be made of any appropriate material, such as silicon, germanium, silicon germanium, silicon carbide, silicon arsenide, or gallium indium, etc.

In one embodiment, the fins 21 and the semiconductor substrate 20 are made of a same material. The semiconductor substrate 20 may be made of silicon; and the fins 21 may be made of silicon. In some embodiments, the fins and the semiconductor substrate may be made of different materials.

In one embodiment, the isolation layer 23 is made of silicon oxide. In some embodiments, the isolation layer may be made of silicon nitride or silicon oxynitride, etc.

In some embodiments, the base substrate may only include the semiconductor substrate.

In one embodiment, the plurality of fins 21 may be parallel to each other. A function doping process may be subsequently performed on a partial number of fins 21. When the function doping process is subsequently performed on the partial number of fins 21, the remaining partial number of the fins 21 need to be protected by photoresist layers from being doped. The function doping process may be used to form lightly doped drain (LDD) regions. The function doping process may also be used to form source/drain doping regions.

The gate structures 22 may include a gate dielectric layer and a gate electrode layer formed on the gate dielectric layer. In one embodiment, the gate structures 22 are polysilicon gate structures. The gate dielectric layer may be made of silicon oxide; and the gate electrode layer may be made of polysilicon.

In some embodiments, the gate structures may be high-K metal gate (HKMG) structures. The gate dielectric layer of the high-K metal gate structures may be made of high dielectric constant (high-K) dielectric material. The high-K dielectric material may refer to a material having a relative dielectric constant greater than the relative dielectric constant of silicon oxide. The gate electrode layer of the high-K metal gate structures may be made of metal, such as Cu, Al, or W, etc.

Each gate structure 22 may cross over at least one fin 21; and may cover portions of the side and top surfaces of the at least one fin 21. For example, each gate structure 22 may cross over one, three or five fins 21. In one embodiment, for illustrative purposes, each gate structure 22 crosses over three fins 21 herein.

In one embodiment, the length direction of the long sides of the gate structures 22 may be perpendicular to the length direction of the fins 21.

Figure 5:
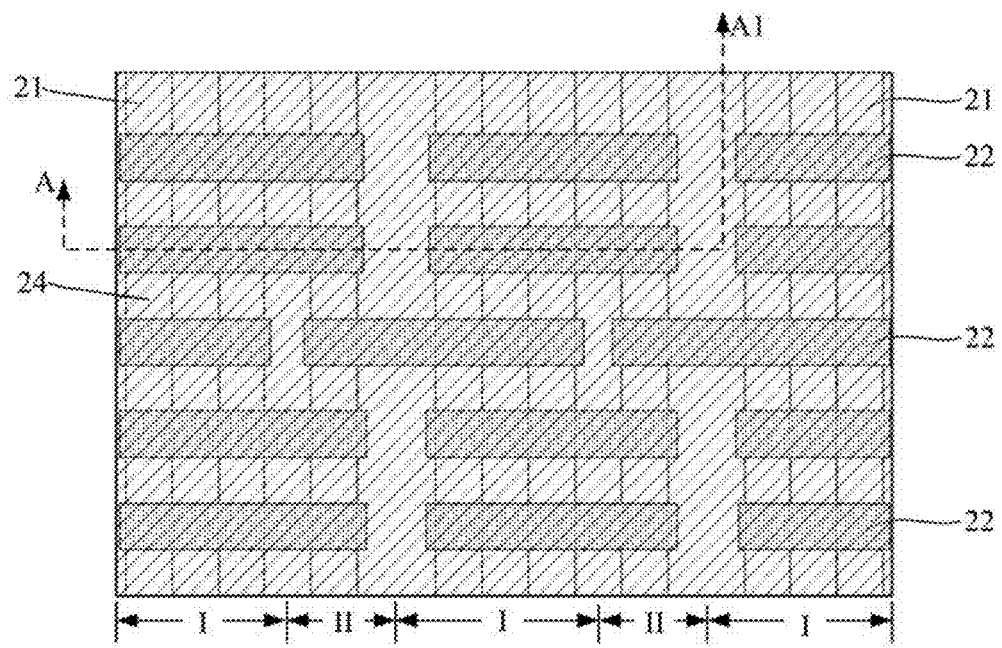
Figure 6:
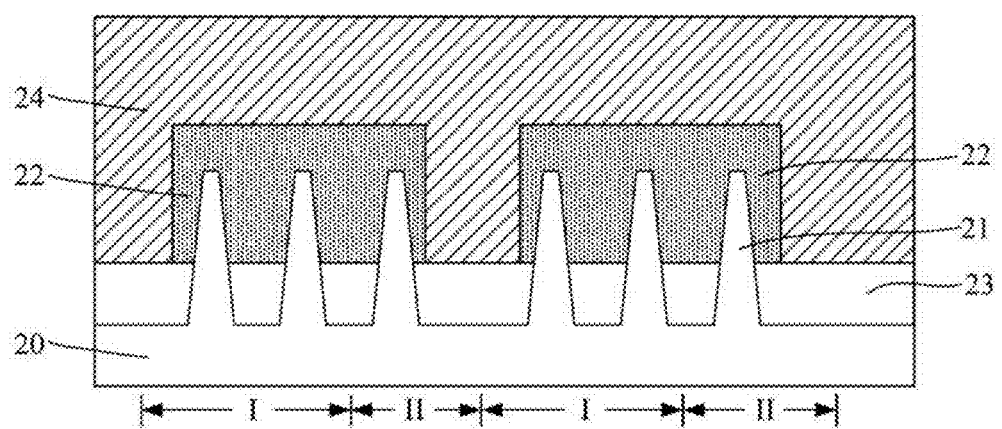

Returning to FIG. 13, after providing the base substrate having the fins 21, the gate structures 22 and the isolation layer 23, a photoresist film may be formed (S102). FIGS. 5-6 illustrate a corresponding semiconductor structure. FIG. 5 is a top view of the semiconductor structure; and FIG. 6 is a cross-sectional view of the structure illustrated in FIG. 5 along the AA1 direction.

As shown in FIGS. 5-6, a photoresist film 24 is formed over the base substrate, the fins 21 and the gate structures 22. The top surface of the photoresist film 24 may be above the top surfaces of the gate structures 22.

The photoresist film 24 may be formed by any appropriate process. In one embodiment, the photoresist film 24 is formed over the isolation layer 23, the fins 21 and the gate structures 22 by a spin-coating process.

The photoresist film 24 may include a plurality of exposure regions I and a plurality of non-exposure regions II. The non-exposure region II may cross over at least one gate structure 22; and the boundary lines between the exposure regions I and the non-exposure regions II may locate between adjacent gate structures 22.

During the subsequent developing process, the portions of the photoresist film 24 in the exposure regions I may be removed by the developing process. That is, the exposure regions I may define the positions and numbers of the fins 21 need to have a subsequent function doping process. Correspondingly, the non-exposure regions II may define the positons and number of the fins 21 need to be protected. The regions above the top surfaces of the gate structures 22 in the exposure regions I may be referred to as first regions (not labeled). The regions below the top surfaces of the gate structures 22 in the exposure regions I may be referred to as second regions (not labeled).

The exposure regions I may be right above at least one fin 21 such that the subsequent function doping process may be able to dope the at least one fin 21 right below the exposure regions I. The boundary lines between the exposure regions I and the non-exposure region II may locate between the adjacent fins 21 so as to ensure the subsequently formed photoresist layers to be able to protect the side surfaces of the fins 21 not expected to be processed by the function doping process. Further, because the length direction of the long sides of the gate structures 22 may be perpendicular to the length direction of the fins 21, the boundary line between the exposure regions I and the non-exposure regions II may locate between the adjacent gate structures 22.

The non-exposure regions II may cross over at least one gate structure 22. In one embodiment, the subsequent function doping process may be performed on the portions of the same fins 21 not covered by the gate structures 22. Thus, the non-exposure regions II may cross over all the gate structures 22 on the same fins 21.

In one embodiment, for illustrative purposes, the exposure regions I may be right above two fins 21. The distributing direction of the exposure regions I may be identical to the distribution direction of the fins 21; and a length direction of the long sides of the exposure regions I may be identical to the length direction of the fins 21.

The photoresist film 24 may be made of any appropriate type of photoresist. In one embodiment, the photoresist film 24 is made of a chemical amplified photoresist (CAR). The material of the photoresist film 24 may be a polyethylene material (such as PHS) with chemical protective function groups (such as t-BOC, etc.). The chemical protective function groups may be insoluble to water; and the CAR may have photoacid generator (PAG) as a photo sensitizer. When an exposure process is performed to the CAR, the PAG in the exposure regions I may have a chemical reaction to generate the photoacid. During the baking process after the exposure process, i.e., the post-baking process, the photoacid may function as a chemical catalyst to remove the chemical protective function groups. Thus, the portions of the photoresist film 24 in the exposure regions I may be dissolved in the developing regent. Further, under the function of the heat during the post-baking process, chain reactions for the generation and the diffusion of the photoacid may continue in the portions of the photoresist film 24 in the exposure regions I. Thus, the quantity of the photoacid in the exposure regions I may be increased.

In some embodiments, the material of the photoresist film may be positive photoresist. The positive photoresist may be poly(methyl methacrylate) (PMMA), or diazonaphtho quinone novolak (DQN), etc.

Figure 7:
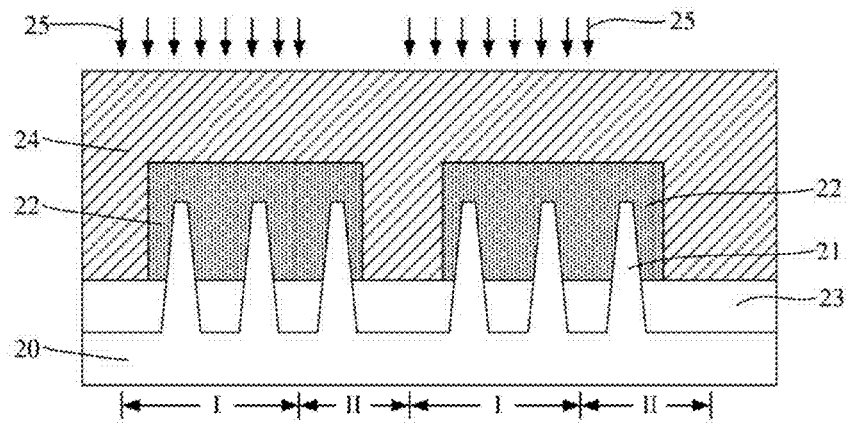

Returning to FIG. 13, after forming the photoresist film 24, an exposure process may be performed (S103). FIG. 7 illustrates a corresponding semiconductor structure based on the structure illustrated in FIG. 6.

As shown in FIG. 7, an exposure process 25 is performed to the photoresist film 24. In one embodiment, the material of the photoresist film 24 is a CAR photoresist. During the exposure process 25, the PAG in the CAR photoresist may have a chemical reaction to generate photoacid. The photoacid may allow the portions of the photoresist film 24 in the exposure regions I to be subsequently removed by a developing process.

During the exposure process 25, the portions of the photoresist film 24 in the exposure regions I may generate the photoacid. Further, the quantity of the photoacid generated in the portions of the photoresist film 24 in the first regions may be smaller than the quantity of the photoacid generated in the portions of the photoresist film 24 in the second regions.

Referring to FIG. 7, trenches may be formed between the adjacent gate structures 22; and the boundary lines between the exposure regions I and the non-exposure regions II may locate in the trenches. During the exposure process 25, a reflective light may be generated in the trenches. The reflective light may further expose the portions of the photoresist film 24 in the second regions. Thus, the portions of the photoresist film 24 in the second regions may receive a stronger light exposure than the portions the photoresist film 24 in the first regions; and the exposure area may be wider. Accordingly, the quantity of the photoacid in the portions of the photoresist film 24 in the second regions may be greater than the quantity of the photoacid in the portions of the photoresist film 24 in the first regions.

Further, because the depth-to-width ratio of the trenches between adjacent gate structures 22 may be relatively large, the light reflection in the trenches having the relatively large depth-to-width ratio may be increased. Thus, the intensity of the reflective light received by the portions of the photoresist film 24 below the gate structures 22 in the first exposure regions may be stronger; and the exposure area may be wider; and the intensity of the reflective light received by the portions of the photoresist film 24 above the gate structures 22 in the exposure regions I may be relatively low.

Thus, in one embodiment, the quantity of the photoacid generated in the portions of the photoresist film 24 in the first regions may be smaller than the quantity of the photoacid generated in the portions of the photoresist film 24 in the second regions.

In one embodiment, a post-baking process may be subsequently performed on the photoresist film 24. Comparing with the conventional post-baking process, the temperature of the subsequent post-baking process may be higher. During the subsequent post-baking process, the quantity of the photoacid in the portions of the photoresist film 24 may be increased. During the exposure process 25, the higher the exposure energy of the exposure process 25 is, the higher the quantity of the photoacid generated in the portions of the photoresist film 24 in the first regions is. Thus, to ensure the distances between adjacent subsequently formed photoresist layers to match a pre-set size, in one embodiment, it may need to consider the temperature of the post-baking process and the size between adjacent photoresist layers to set up the exposure energy of the exposure process 25.

Thus, in one embodiment, the exposure energy of the exposure process 25 may be inversely proportional to the temperature of the post-baking process. To ensure the distances between adjacent photoresist layers to match the pre-set size, if a higher temperature is used in the post-baking process, a lower exposure energy may be used in the exposure process 25.

Figure 8:
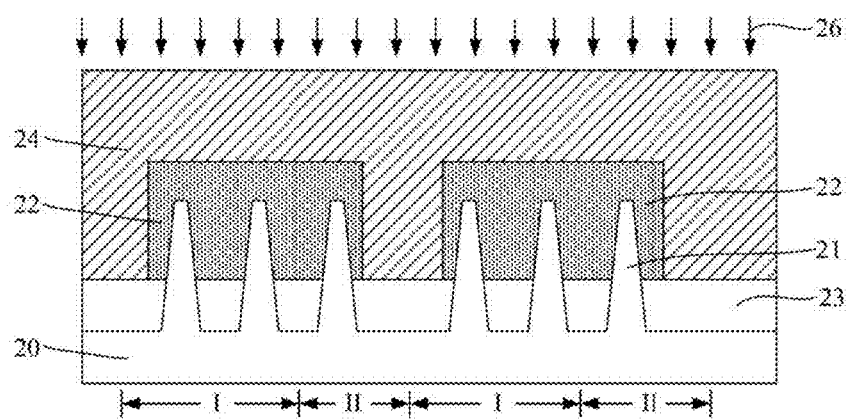

Returning to FIG. 13, after performing the exposure process 25, a post-baking process may be performed (S104). FIG. 8 illustrates a corresponding semiconductor structure.

As shown in FIG. 8, a post-baking process 26 is performed to the exposed photoresist film 24. In one embodiment, one of the purposes of the post-baking process 26 is to further increase the quantity of the photoacid in the portions of the photoresist film 24 in the exposure regions I under a thermal reaction; and to cause the photoacid in the portions of the photoresist film 24 in the first regions to diffuse into the non-exposure regions II.

During the exposure process 25, the effect of the reflective light to the portions of the photoresist film 24 in the first regions may be smaller than the effect of the reflective light to the portions of the photoresist film 24 in the second regions. The quantity of the photoacid in the portions of the photoresist film 24 in the first regions may be smaller than the quantity of the photoacid in the portions of the photoresist film in the second regions. Thus, during the post-baking process 26, the increasing rate of the photoacid in the portions of the photoresist film 24 in the second regions may be greater than the increasing rate of the photoacid in the portions of the photoresist film 24 in the first regions.

Further, the diffusion rate of the photoacid in the photoresist film 24 is proportional to the quantity of the photoacid in the photoresist film 24 before the post-baking process 26. Thus, during the post-baking process 26, the diffusion rate of the photoacid in the portions of the photoresist film 24 in the second regions may be greater than the diffusion rate of the photoacid in the portions of the photoresist film 24 in the first regions.

With the increasing of the temperature of the post-baking process 26, the increasing rate of the photoacid in the photoresist film 24 may be correspondingly increased. Further, the increasing rate of the photoacid in the portions of the photoresist film 24 in the second regions may be still greater than the increasing rate of the photoacid in the portions of the photoresist film 24 in the first regions.

With the increasing of the temperature of the post-baking process 26, the diffusion rate of the photoacid in the photoresist film 24 may also be correspondingly increased. Further, the diffusion rate of the photoacid in the portions of the photoresist film 24 in the second regions may be still greater than the diffusion rate of the photoacid in the portions of the photoresist film 24 in the first regions.

Thus, the post-baking process 26 may cause the photoacid in the second regions to diffuse into the portions of the photoresist film 24 below the top surfaces of the gate structures 22 in the non-exposure regions II. In one embodiment, after the post-baking process 26, the portions of the photoresist film 24 blow the gate structures 22 in the non-exposure regions II may be entirely covered by the photoacid.

In one embodiment, an optimal temperature may be determined for the post-baking process 26. For example, after performing the post-baking process 26 with the optimal temperature, the subsequent developing process may be able to remove all the portions of the photoresist film 24 below the top surfaces of the gate structures 22 in the non-exposure regions II.

The method for determining the optimal temperature may include gradually increasing the temperature of the post-baking process until the portions of the photoresist film 24 below the top surfaces of the gate structures 22 in the non-exposure region II may be entirely covered by the photoacid. During the subsequent developing process, the portions of the photoresist film 24 below the gate structures 22 in the non-exposure regions II may be entirely removed; and the portions of the photoresist film 24 above the top surfaces of the fins 24 in the non-exposure regions II may be kept. The corresponding temperature may be configured as the optimal temperature of the post-baking process 26.

Figure 9:
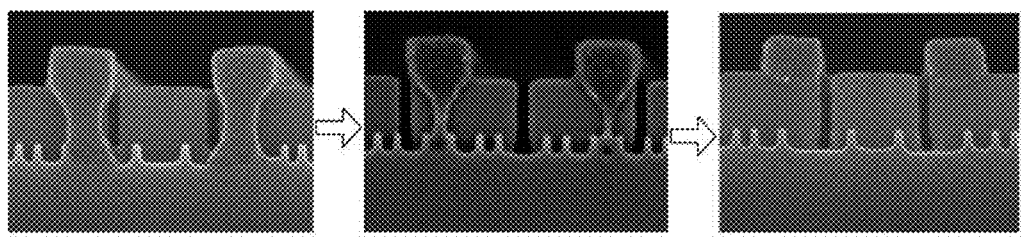

FIG. 9 illustrates SEM images of the FinFET device corresponding to different post-baking temperatures during the process for determining the optimal temperature of the post-baking process. The SEM images illustrate FinFET device obtained from three different post-baking temperatures. After the post-baking process, a developing process may be performed to obtain the structures illustrated in FIG. 9. From the left to the right, the baking temperatures are increased.

The left SEM image in FIG. 9 may correspond to the lowest temperature of three temperatures. As shown in the SEM image, under such a post-baking temperature, the portions of the photoresist film below the gate structures in the non-exposure regions may still have defects, such as the necking defects.

The middle SEM image in FIG. 9 may correspond to a medium temperature, i.e., an increased temperature, of the three temperatures. As shown in the SEM image, comparing with the left SEM image in FIG. 9, when the post-baking temperature is increased, the removed quantity of the portions of the photoresist film below the top surfaces of the gate structures in the non-exposure regions may be significantly increased, but the necking defects may still exist.

The right SEM in FIG. 9 may correspond to an optimal post-baking temperature. The optimal post-baking temperature may be greater than the post-baking temperature used to obtain the structure shown in the middle SEM image. When the post-baking temperature is increased to the optimal temperature. The portions of the photoresist film below the top surfaces of the gate structures in the non-exposure regions may be entirely removed by the developing process. Further, the portions of the photoresist film above the gate structures in the non-exposure regions may be kept.

To prevent the photoacid in the portion of the photoresist film 204 in the first regions from diffusing into the portions of the photoresist film 24 above the gate structures 22 in the adjacent non-exposure regions II because of an excessive quantity; and ensure the distances between the subsequently formed photoresist layers to match the pre-set size, when the temperature of the post-baking process is relatively high, the exposure energy of the exposure process 25 may be relatively low.

For illustrative purposes, the distance between the subsequently formed adjacent photoresist layers may be approximately 0.275 µm. The temperature of the post-baking process 26 may be increased from 90° C. to 110° C. Correspondingly, the exposure energy of the post-exposure process 25 may be reduced from 45 mJ to 21 mJ. Such a temperature and an exposure energy may ensure the distances between the subsequently formed adjacent photoresist layers to match the pre-set size. In some embodiments, the distances between the subsequently formed photoresist layers may other appropriate value, the temperature of the post-baking process and the exposure energy may correspondingly have other appropriate combinations.

In some embodiments, according to the different distances between the subsequently formed adjacent photoresist layers, the temperature of the post-baking process and the exposure energy of the exposure process may be adjusted. By performing the adjustments, after the post-baking process, during the subsequent developing process, the portions of the photoresist film in the exposure regions may be entirely removed by the developing process; the portions of the photoresist film below the top surfaces of the gate structures in the non-exposure regions may be entirely removed by the developing process; and the portions of the photoresist film above the top surfaces of the gate structures in the non-exposure regions may be kept.

Figure 10:
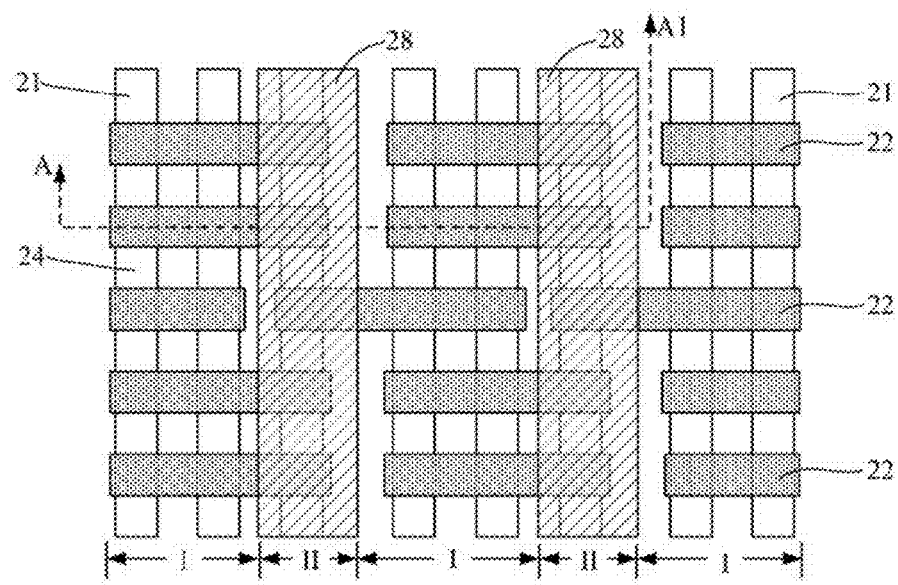

Returning to FIG. 13, after performing the post-baking process 26, a developing process may be performed (S105). FIGS. 10-11 illustrate a corresponding semiconductor structure. FIG. 10 is a top view of the semiconductor structure; and FIG. 11 is a cross-sectional view of the structure illustrated in FIG. 10 along the AA1 direction.

As shown in FIGS. 10-11, after performing the post-baking process 26 (referring to FIG. 8), a developing process 27 may be performed to the baked photoresist film 24. The developing process 26 may remove the portions of the photoresist film 24 in the exposure regions I and the portions of the photoresist film 24 below the top surfaces of the gate structures 22 in the non-exposure regions II. The portions of the photoresist film 24 above the top surfaces of the gate structures 22 in the non-exposure regions II may be kept; and configured as photoresist layers 28. The photoresist layers 28 may cross over at least one gate structure 22; and expose portions of the fins 21.

A large quantity of the photoacid may be generated in the portions of the photoresist film 24 in the exposure regions I. The photoacid may be able to remove the protective function groups in the portions of the photoresist film 24 in the exposure regions I. Thus, during the developing process 27, the portions of the photoresist film 24 in the exposure regions I may be dissolved in the developing solution of the developing process 27.

Further, during the post-baking process 26, the photoacid in the portions of the photoresist film 24 in the second regions may diffuse into the portions of the photoresist film 24 below the top surfaces of the gate structures 22 in the non-exposure regions II; and the portions of the photoresist film 24 below the gate structures 22 in the non-exposure regions II may be entirely covered by the photoacid. Thus, the solubility of the portions of the photoresist film 24 below the top surfaces of the gate structures 22 in the non-exposure regions II may be relatively large. Thus, the portions of the photoresist film 24 below the top surfaces of the gate structures 22 in the non-exposure regions II may be entirely removed by the developing process 27.

The photoresist layers 28 may define the positions and the number of the fins 21 need to be protected. The photoresist layers 28 may expose at least one fin 21 such that a function doping process may be subsequently performed on the exposed fin 21. The side surfaces of the photoresist layers 28 may locate between the adjacent fins 21. Thus, the photoresist layers 28 may protect the side surfaces of the fins 21 need not to be doped by the subsequent function doping process. Further, the side surfaces of the photoresist layers 28 may also locate between the adjacent gate structures 22.

The photoresist layers 28 may cross over at least one gate structure 22. In one embodiment, a function doping process may be subsequently performed on portions of the fins 21 exposed by the gate structures 22. Thus, the photoresist layers 28 may cover all the gate structures 22 crossing over a same fin 21.

The distribution direction of the photoresist layers 28 may be identical to the distribution direction of the fins 21. The length direction of the long sides of the photoresist layers 28 may be parallel to the length direction of the fins 21.

In one embodiment, because the developing process 27 may be able to entirely remove the portions of the photoresist film 24 below the top surfaces of the gate structures 22 in the non-exposure regions II. Thus, the necking defects and the bottom-residue defects in the portions of the photoresist film 24 below the top surfaces of the gate structures 22 in the non-exposure regions II may be avoided. Accordingly, the photoresists layers 28 may be able to precisely define the positions of the fins 21 need to have a subsequent function doping process; and may prevent the fins 21 need to have the subsequent function doping process from being covered by the photoresist layers 28. Thus, the accuracy of the subsequent function doping process may be improved.

The developing solution used in the developing process 27 may be an alkaline solution. In one embodiment, the developing solution is a tetramethylammonium hydroxide (TMAH) solution.

Returning to FIG. 13, after forming the photoresist layers 28, a function doping process may be performed (S106). FIG. 12 illustrates a corresponding semiconductor structure.

As shown in FIG. 12, a function doping process 29 is performed to the exposed portions of the fins 21. The photoresist layers 28 may be used as a mask layer for performing the function doping process 29.

In one embodiment, for illustrative purposes, the function doping process 29 may be used to form LDD regions. When the exposed portions of the fins 21 are used to form NMOS devices, the doping ions of the function doping process 29 may be N-type ions, such as P ions, As ions, or Sb ions, etc. When the exposed portions of the fins 21 are used to form PMOS devices, the doping ions of the function doping process 29 may be P-type ions, such as B ions, Ga ions, or In ions, etc.

In some other embodiments, the function doping process may be used to form heavily doped regions or pocket regions, etc.

The function doping process 29 may be performed by appropriate process. In one embodiment, the function doping process 29 is an ion implantation process.

In one embodiment, to avoid the non-necessary ion implanting to the portions of the fins 21 right below the photoresist layers 28, in the ion implantation process, the implanting angle may be approximately 0. That is, the direction of the ion beam may be perpendicular to the surface of the base substrate. In some embodiments, the implanting angle may be smaller than, or equal to approximately 10°.

In one embodiment, during the function doping process 29, the effective thickness of the photoresist layers 28 may be the effective thickness of the portions of the photoresist layers 28 above the gate structures 22. Thus, the effective thickness of the photoresist layers 28 may be smaller than the effective thickness of the photoresist film 24 without being developed to remove the portions of the photoresist film below the gate structures 22 to form the photoresist layers 28. Thus, to ensure the photoresist layers 28 to have an enough protective function, the thickness of the photoresist film 24 may be increased during the process for forming the photoresist film 24 such that the corresponding photoresist layers 28 may have an enough thickness to provide the enough protection to the fins 21.

In one embodiment, the photoresist layers 28 may be able to precisely define the positions of the fins 21 need to be doped by the function doping process 29; and prevent the fins 21 need to be doped by the function doping process 29 from being covered by the photoresist layers 28. Thus, the accuracy of the function doping process 29 may be improved.

Further, in the disclosed methods for fabricating the FinFET device, the measured position and size parameters may accurately represent the characteristic parameters of the finally formed photoresist layers. Thus, according to the measured position and size parameters, the process parameters may be timely adjusted; and the position precision and the size precision of the photoresist layers may be improved.

If the portions of the photoresist film below the top surfaces of the gate structures are kept, the formed photoresist layers may have bottom-residue defects. When the characteristic parameters of the photoresist layers are measured, the measurement may include the position and the size parameters of the bottom-residue defects; and the measured size of the photoresist layers may be greater than the real size of the photoresist layers; and the measured boundary positions may be unable to truly represent the real boundary positions of the photoresist layers. Thus, when the measured distorted characteristic parameters of the photoresist layers are used to adjust the process parameters, the position precision and the size precision of the photoresist layers after the adjustment may be unacceptable; and the performance of the FinFET device formed by such adjusted parameters may be not as desired.

After performing the function doping process 29, other appropriate structures may be formed on the semiconductor structure illustrated in FIG. 12. Other appropriate process (es) may also be performed on the semiconductor structure.

Thus, an FinFET device may be formed by the disclosed methods and processes. FIG. 12 illustrates a corresponding FinFET device.

As shown in FIG. 12, the FinFET device may include a semiconductor substrate 20; and a plurality of fins 21 formed on the semiconductor substrate 20. The FinFET device may also include an isolation layer 22 formed on the surface of the semiconductor substrate 20, covering portions of the side surfaces of the fins 21, and with top surface below the top surfaces of the fins 21. Further, the FinFET device may also include a plurality of gate structures 22 crossing over the plurality of fins 21 and covering positions of the side surfaces of the fins 22, and formed on the surface of the isolation layer 23. Further, the FinFET device may include lightly doped drain regions formed in the fins 21 at two sides of the gate structures 22. The detailed structures and intermediate structures are described above with respect to the fabrication processes.

A photoresist film may be formed over the base substrate, the fins and the gate structures; and the photoresist film may be right above at least one fin; and the boundary lines between the exposure regions and the non-exposure regions may locate between adjacent gate structures. An exposure process may be performed to the portions of the photoresist film in the exposure regions. During the exposure process, because the portions of the photoresist film below the top surfaces of the gate structures in the exposure regions may receive a relatively larger amount of reflective light. The portions of the photoresist film below the top surfaces of the gate structures may have larger exposure intensity and a larger exposure area than the portions of the photoresist film above the top surfaces of the gate structures in the exposure regions. Thus, the amount of the photoacid generated in the portions of the photoresist film below the top surfaces of the gate structures in the exposure regions may be greater than the amount of photoacid generated in the portions of the photoresist film above the top surfaces of the gate structures in the exposure regions. Under the thermal reaction of a subsequent post-baking process, the increasing rate and the diffusion rate of the photoacid in the first regions may be both smaller than the increasing rate and diffusion rate of the photoacid in the second regions. Thus, the photoacid in the second regions may diffuse into the portions of the photoresist film below the gate structures in the non-exposure regions. Thus, during the developing process, the portions of the photoresist film below the top surfaces of the gate structures in the non-exposure regions may have a relatively large dissolving rate in the developing solution. Thus, the portions of the photoresist film below the top surfaces of the gate structures in the non-exposure regions and the portions of the photoresist film in the exposure regions may be entirely removed by the developing process. The present disclosed methods may be able to avoid the bottom-residue defects and the necking defects in the portions of the photoresist film below the top surfaces of the gate structures from the fabrication method of the FinFET device. Thus, when a function doping process is performed to the exposed fins using the photoresist layers as a mask, the position precision of the function doping process may be improved; and the electrical properties of the FinFET device may be improved.

Further, the higher the exposure energy is, the higher the quantity of the photoacid in the portions of the photoresist film in the exposure regions is. The higher the temperature of the post-baking process is, the higher the increasing rate of the photoacid in the portions of the photoresist film in the exposure regions is. Thus, in the disclosed embodiments, the exposure energy of the exposure process may be inversely proportional to the temperature of the post-baking process. By lowering the exposure energy, the photoacid increasing issue in the portions of the photoresist film in the exposure regions caused by the increasing of the temperature of the post-baking process may be balanced. Thus, the excessive quantity of the photoacid in the portions of the photoresist film in the exposure regions after the post-baking process may be avoided; and it may ensure the distances between the adjacent photoresist layers to match the pre-set size.

In some embodiments, the implanting angle of the function doping process may be approximately 0°. Thus, the doping to the fins right below the photoresist layers may be avoided. Accordingly, the electrical properties of the FinFET device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating fin field-effect transistors, comprising:
   providing a base substrate having a plurality of fins;
   forming a plurality of gate structures, each gate structure covering side and top surfaces of at least one fin, over the base substrate;
   forming a photoresist film, having a plurality of exposure regions and a plurality of non-exposure regions, over the base substrate, the fins and the gate structures, wherein the exposure regions have first regions above the top surfaces of the gate structures and second regions below the top surfaces of the gate structures;
   performing an exposure process to the photoresist film, a concentration of the photoacid generated in the first regions being smaller than a concentration of the photoacid generated in the second regions;
   performing a post-baking process to cause photoacid in the second regions of the exposure regions to diffuse into portions of the photoresist film below the top surfaces of the gate structures in the non-exposure regions;
   developing exposed photoresist film to form photoresist layers; and
   performing a function doping process to the fins using the photoresist layers as a mask.

2. The method according to claim 1, wherein:
   a top surface of the photoresist film is above top surfaces of the gate structures;
   the exposure regions locate right above the at least one fin; and
   boundary lines of the exposure regions and the non-exposure regions locate between adjacent gate structures.

3. The method according to claim 1, during the post-baking process, wherein:
   an increasing rate of the photoacid in portions of the photoresist film in the second regions is greater than an increasing rate of the photoacid in portions of the photoresist film in the first regions; and
   a diffusion rate of the photoacid in portions of the photoresist film in the second regions is greater than a diffusion rate of the photoacid in portions of the photoresist film in the first regions.

4. The method according to claim 1, after the post-baking process, wherein:
   portions of the photoresist film below the top surfaces of the gate structures in the non-exposure regions are entirely covered by the photoacid.

5. The method according to claim 1, wherein:
   an exposure energy of the exposure process is inversely proportional to a temperature of the post-baking process.

6. The method according to claim 1, further comprises:
   determining a temperature for the post-baking process, such that the portions of the photoresist film below the gate structures in the non-exposure regions are entirely removed by the developing process after the post-baking process using the determined temperature.

7. The method according to claim 6, wherein determining the temperature comprises:
   increasing the temperature of the post-baking process to a certain temperature under which the portions of the photoresist film below the top surfaces of the gate structures in the non-exposure regions are entirely covered by the photoacid and the portions of the photoresist film below the top surfaces of the gate structures in the non-exposure regions are entirely removed by the developing process; and
   configuring the certain temperature as the determined temperature of the post-baking process.

8. The method according to claim 7, during a process for determining the temperature for the post-baking process, wherein:
   when the temperature of the post-baking process is increased from approximately 90° C. to approximately 110° C., the exposure energy of the exposure process is reduced from approximately 45 mJ to approximately 21 mJ.

9. The method according to claim 1, wherein:
   the photoresist film is made of a chemical amplified resist (CAR) material.

10. The method according to claim 1, wherein:
    the photoresist film is made of one of poly(methyl methacrylate) (PMMA) and diazonaphtho quinone novolak (DQN).

11. The method according to claim 1, wherein:
the exposure regions locate right above the at least one fin; and
a boundary line between the exposure regions and the non-exposure regions locates between adjacent fins.

12. The method according to claim 1, wherein:
the non-exposure regions cross over all the gate structures on a same fin.

13. The method according to claim 12, wherein:
a distribution direction of the non-exposure regions is identical to a distribution direction of the plurality of fins; and
a length direction of long sides of the exposure regions is identical to a length direction of the fins.

14. The method according to claim 1, wherein:
the function doping process is an ion implantation process; and
an ion implanting angle is smaller than, or equal to approximately 10°.

15. The method according to claim 14, wherein:
the ion implanting angle is approximately 0°.

16. The method according to claim 1, wherein:
the base substrate includes a semiconductor substrate and an isolation layer formed on the semiconductor substrate;
the plurality of the fins are formed on the semiconductor substrate;
the isolation layer covers portions of side surfaces of the fins; and
a top surface of the isolation layer is below the top surfaces of the fins.

17. The method according to claim 1, wherein:
the function doping process is used to form one of lightly doped drain regions and heavily doped regions.

18. A fin field-effect transistor (FinFET) device, comprising:
a semiconductor substrate;
a plurality of fins formed on the semiconductor substrate;
an isolation layer formed on the surface of the semiconductor substrate, covering portions of the side surfaces of the fins, and with top surface below the top surfaces of the fins;
a plurality of gate structures crossing over the plurality of fins and covering positions of the side surfaces of the fins, and formed on the surface of the isolation layer; and
lightly doped drain regions formed in the fins at two sides of each of the gate structures,
wherein the lightly doped drain regions are formed by:
    forming a photoresist film, having a plurality of exposure regions and a plurality of non-exposure regions, over the base substrate, the fins and the gate structures, wherein the exposure regions have first regions above the top surfaces of the gate structures and second regions below the top surfaces of the gate structures;
    performing an exposure process to the photoresist film, a concentration of the photoacid generated in the first regions being smaller than a concentration of the photoacid generated in the second regions;
    performing a post-baking process to cause photoacid in the second regions of the exposure regions to diffuse into portions of the photoresist film below the top surfaces of the gate structures in the non-exposure regions;
    developing exposed photoresist film to form photoresist layers; and
    performing a function doping process to the fins using the photoresist layers as a mask.

19. The FinFET device according to claim 18, wherein:
the post-baking process has an optimal temperature; and
the portions of the photoresist film below the gate structures in the non-exposure regions are entirely removed by the developing process after the post-baking process using the optimal temperature.

20. The FinFET device according to claim 18, wherein:
a developing solution for developing the exposed photoresist film is an alkaline solution.

* * * * *